United States Patent
Espinoza-Ibarra et al.

(10) Patent No.: US 7,337,018 B2
(45) Date of Patent: Feb. 26, 2008

(54) HEAT SINK FAN MANAGEMENT BASED ON PERFORMANCE REQUIREMENTS

(75) Inventors: Ricardo Espinoza-Ibarra, Lincoln, CA (US); Andrew H. Barr, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1036 days.

(21) Appl. No.: 10/632,218

(22) Filed: Jul. 31, 2003

(65) Prior Publication Data

US 2005/0024828 A1 Feb. 3, 2005

(51) Int. Cl.
*G05B 11/01* (2006.01)
(52) U.S. Cl. ....................................... 700/19
(58) Field of Classification Search ............ 700/9, 700/12, 19, 300
See application file for complete search history.

(56) References Cited

U.S. PATENT DOCUMENTS

| | | | |
|---|---|---|---|
| 5,249,741 A * | 10/1993 | Bistline et al. ............ 236/49.3 |
| 5,761,085 A * | 6/1998 | Giorgio ....................... 702/33 |
| 6,041,850 A * | 3/2000 | Esser et al. ............ 165/104.33 |
| 6,101,459 A | 8/2000 | Tavallaei et al. |
| 6,104,003 A * | 8/2000 | Jones ....................... 219/400 |
| 6,487,463 B1 | 11/2002 | Stepp, III |
| 6,597,972 B2 * | 7/2003 | Emberty et al. ............ 700/304 |
| 6,792,550 B2 | 9/2004 | Osecky et al. |

OTHER PUBLICATIONS

Great Britain Search Report. Application No. GB0416956.1. Dec. 21, 2004.

* cited by examiner

*Primary Examiner*—Thomas K Pham
(74) *Attorney, Agent, or Firm*—Connolly Bove Lodge & Hutz, LLP

(57) ABSTRACT

A fan system is described for cooling a heat dissipating component within an electronic system. The fan system includes a fan that is controllable to a desired operating speed and operatively connected to the heat dissipating component. The fan system further includes a fan manager that determines an operating parameter indicative of the heat dissipated by the heat dissipating component, calculates a control signal indicative of the desired speed of the fan based upon the value of the operating parameter, and communicates the control signal to the fan to control its speed.

34 Claims, 2 Drawing Sheets

HEAT SINK FAN MANAGEMENT BASED ON PERFORMANCE REQUIREMENTS

BACKGROUND

1. Field of the Invention

The present invention relates generally to the cooling of electronic systems having multiple heat dissipating components such as processors and, more particularly, to managing heat sink fan(s) based on performance requirements.

2. Related Art

CPUs, CECs (generally, processors) and other heat dissipating components found in typical computer servers generally include a heat sink attached to a given component. These heat sinks often include a fan that pushes air through the heat sink and/or the component in order to keep the heat dissipating component from overheating. As electronic systems become more densely packaged and designing electronic systems within power and heat dissipation budgets becomes more difficult, a number of design challenges arise with respect to the power used by the fans and the effect of the fans on the heat dissipation characteristics of the overall system.

As an example of such densely packaged electronic systems, advances in the miniaturization of computer, communication and other electronic equipment have led to the development of so-called "blade" systems, which permit several circuit boards ("blades") to be installed in a single chassis. The chassis typically includes components, such as power supplies, cooling fans, a blade manager, and other components that are shared by all the blades installed in the chassis. The blades typically plug into a backplane of the chassis, which distributes power and data signals between the blades, blade manager, and other components. This arrangement enables a large number of blades to be housed in a relatively small chassis. Oftentimes, the chassis is dimensioned to be mounted in a rack, such as a server rack with other rack-mounted equipment.

Blades can perform various functions. Most blades contain entire computers, including single or multiple processors, memory, and network interfaces. Most computer blades are used as servers while others are used as communication devices, such as routers, firewalls or switches. Some blades contain specialized hardware components, in addition to or instead of processors, memory, etc. In general, blades include any number of heat dissipating components.

Some server blades include disk drives. Other blades access disk drives that are located elsewhere in the chassis or are connected to the chassis by computer network hardware. Typically, any type of blade can be plugged into any slot of a chassis. This enables an operator or system manager to "mix and match" blades in a chassis so that requisite operations can be performed by the blade system. In addition, the mixture of blade types can be changed to accommodate changes in operational requirements. For example, a system operator might choose to logically connect a blade to different disk drives to execute different application programs at different times of a day. In another example, if a blade fails, logical connections from off-blade disk drives that were formerly used by the failed blade can be redirected to a replacement or hot standby blade.

As noted above, while such densely packaged electronic systems as blade systems provide many advantages, several engineering challenges arise when using them. Among these challenges is the challenge of designing and operating a bladed system such that sufficient heat is dissipated in the limited space available in the chassis that hosts the system. Some known power limiting strategies include powering down a CPU functional unit, e.g., a floating point unit or an on-die cache, or trading off speed for reduced power consumption in a hard drive. To address heat dissipation challenges, bladed server systems can be designed with an underlying power and thermal envelope. For example, when a chassis that hosts a bladed system has a limited amount of airflow available to cool the blades (i.e., when the system can only dissipate a limited amount of heat), then the chassis is designed for a limited amount of power consumption and an associated limited performance of the blades.

As a result of the modularity, flexibility, and requirements of such bladed systems however, different portions of the system, including different blades and even different heat dissipating components, will have varied heat dissipation needs that will further vary over time given changes in operating conditions of the components and blades. In typical systems, the fans associated with heat dissipating components simply run at full speed at all times. In other systems, the speed of all fans can be varied together based on an overall system temperature.

SUMMARY OF THE INVENTION

In one aspect of the invention, an electronic system having a plurality of heat dissipating components and a fan manager. Each heat dissipating component has an independently controllable cooling fan operatively connected thereto. The fan manager communicates with each component to determine an operating parameter of each component and, based on the determined operating parameter for each component, generates control signals to independently control each cooling fan.

In another aspect of the invention, a method of cooling heat dissipating components is provided for an electronic system having a plurality of heat dissipating components, a cooling fan operatively connected to each heat dissipating component, and a fan manager. In this method, the fan manager determines an operating parameter for each heat dissipating component and generates control signals to independently control each cooling fan based on the operating parameter of the heat dissipating component that is operatively connected to that fan.

In yet another aspect of the invention, a fan manager is provided for cooling heat dissipating components in an electronic system having a plurality of heat dissipating components and a cooling fan operatively connected to each heat dissipating component. The fan manager includes a determinator communicating with each heat dissipating component to determine an operating parameter of each heat dissipating component and a controller generating control signals to independently control each cooling fan based on the determined operating parameter of the component operatively connected to that fan.

In a still further aspect of the invention, a fan system for cooling a heat dissipating component within an electronic system is provided. The fan system includes a fan that is controllable to a desired operating speed and operatively connected to the heat dissipating component. The fan system further includes a fan manager that determines an operating parameter indicative of the heat dissipated by the heat dissipating component, calculates a control signal indicative of the desired speed of the fan based upon the value of the operating parameter, and communicates the control signal to the fan to control its speed.

DETAILED DESCRIPTION

The present invention provides methods and systems to automatically manage cooling fan operating conditions for cooling fans operatively connected to heat dissipating components within an electronic system having a plurality of heat dissipating components such as processors. The electronic system includes a fan manager that communicates with each of the plurality of components to determine at least one operating parameter of each component. The fan manager can calculate a desired speed for the fans connected to each component based on the operating parameter or parameters determined for that component, and can communicate a control signal to each fan to set its speed.

Electronic systems of the invention can include a variety of systems having multiple processors or other high heat dissipating components. Such systems include, for example, desktop personal computers or workstations having multiple processors, rack mounted servers having multiple processors on a single server or having multiple processors spread over several rack mounted devices, and multiprocessor blades or bladed systems in which a plurality of processors are spread out over a number of blades within the system. For purposes of providing an example, the present invention will be described in the context of a blade system. As noted, a blade system is a printed circuit board which is installed in a chassis along with a plurality of other printed circuit boards, or blades. In such a system, the operational characteristics of blades, or even of individual processors or components, can be adjusted by a blade manager. Operating parameters of the components within a blade system can thus change over time and, with the changing operating parameters, the cooling requirements of individual blades and components will change over time. One of ordinary skill in the art can, however, apply the teachings herein to other types of electronic systems, including but not limited to those listed above.

Figure 1:
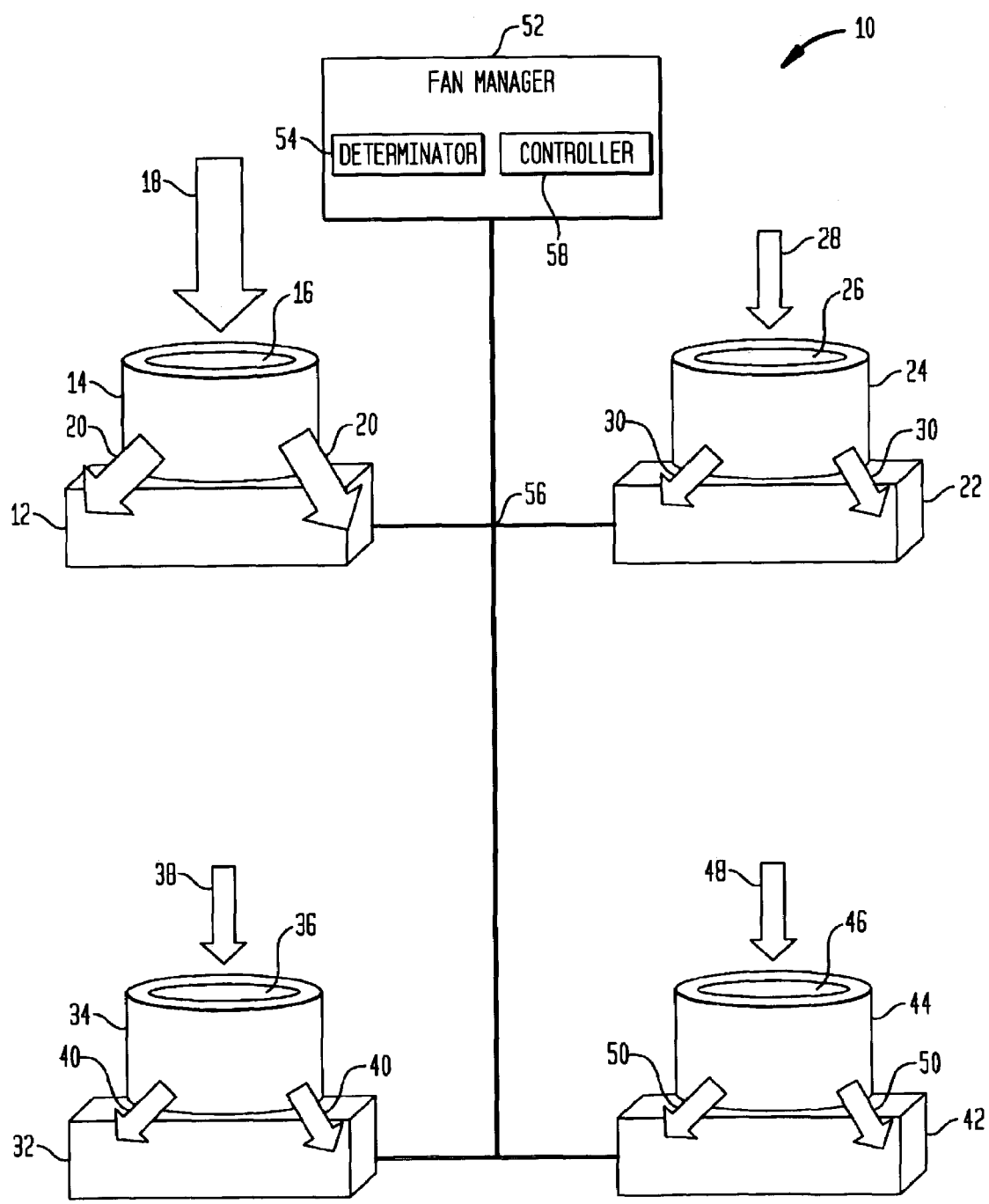
FIG. 1 is a diagrammatic illustration of an electronic system of the invention.

FIG. 1 illustrates diagrammatically an electronic system 10 of the invention having four heat dissipating components, namely, four illustrated processors (CPUs 12, 22, 32, 42). First processor 12 has a heatsink 14 and fan 16 operatively connected thereto. As used herein, having a fan or heatsink operatively connected to a processor means that the fan or heatsink is associated with the processor in such a way as to directly impact the cooling of that processor. In the illustrated instance, fan 16 draws input air 18 into the fan and distributes output air 20 onto heatsink 14 and processor 12 to thereby cool the processor and the heatsink (which in turn cools the processor by conduction) by convection.

As with first processor 12, second, third, and fourth processors 22, 32, 42 also include heat sinks 24, 34, 44 and fans 26, 36, 46 that draw in input air 28, 38, 48 and distribute output air 30, 40, 50 to cool the processors. In the illustrated embodiment, each cooling fan 14, 24, 34, 44 is operatively connected to an individual processor 12, 22, 32, 42, respectively.

A fan manager 52 includes a determinator 54, which communicates with each processor 12, 22, 32, 42 through communication element 56 to determine at least one operating parameter of each of the processors. Generally, the operating parameter or parameters determined will be indicative of the cooling requirements of the individual processors. Such operating parameters include, for example, the frequency at which the processor is operating, the power that the processor is consuming, the voltage at which the processor is operating, the current temperature or change in temperature over time of the processor, whether the processor is active, or other parameters known in the art to be measurable for a processor and to be indicative of the processor's cooling requirements.

It should be noted that, although the fan manager 52 functionality has been illustrated in a single functional block in the functional diagram of FIG. 1, fan manager functionality can be distributed within the system to the point where each individual component or processor includes its own fan management functionality. Such a distribution of fan manager functionality can be particularly useful when the operating parameters to be determined for the purpose of fan control are, or include, operating parameters that are specific to or directly related to the processor or other component that is being cooled.

For example, where the heat dissipating component being cooled is a CPU, fan manager 52 functionality local to that CPU (meaning that the fan manager functionality is either on the CPU itself, is closely coupled to the individual CPU, or is a combination of the two) can determine what operations the CPU is likely to perform in the near future as the operating parameter to be determined—for example, if the chip will be called on to execute floating point operation instructions (a high power consuming process), fan manager 52 can increase the speed of the fan for that CPU in advance of the power consumption in order to maintain a more regulated and steady temperature, and thus reduce or avoid thermal stressing of the physical CPU. In this case, the determinator 54 of a local fan manager 52 would determine which instructions are to be processed by the CPU in the future. Examples of how this could be done include monitoring of the system bus to track the instructions that are targeted to a particular CPU, or using the branch prediction unit of the CPU (if the CPU is so equipped) to determine the instructions that will be processed.

Fan manager 52 functionality can thus be centrally provided (one fan manager determining parameters for a plurality of heat dissipating components and independently controlling the fans), distributed (with each heat dissipating component having local fan manager functionality), or a combination of both with distributed fan managers determining local operating parameters for heat dissipating components and communicating with a centralized fan manager element as well.

With operating parameters for each processor 12, 22, 32, 42 received, a fan manager controller 58 then calculates desired speeds for each fan 16, 26, 36, 46 (using, for example, a policy management system having policies that define proper fan operation) and communicates control signals indicative of the calculated speeds to the fans through communication element 56. In one embodiment, the speed of fans 16, 26, 36, 46 is established by pulse width modulation as is known in the art, and control signals communicated by fan manager 52 are indicative of the pulse width to be employed, and thus the speed of the fans operatively connected to the separate processors.

In the illustrated embodiment, the fan 16 operatively connected to first processor 12 is drawing in more air 18 and outputting to the processor more air 20 than is the case for fans 26, 36, 46 operatively connected to second, third and fourth processors 22, 32, 42. This illustrated circumstance represents a scenario in which the cooling requirement of first process 12 is higher than the cooling requirements of other processors 22, 32, 42. This might be the case, for example, where all four processors are of similar design but first processor 12 is operating at a high frequency while second, third and fourth processors 22, 32, 42 are all operating at a lower frequency. In this situation, fan manager 52 calculates and communicates control signals to fans 16, 26, 36, 46 that result in the fan 16 operatively connected to first processor 12 operating at a higher speed than the other fans. If the frequencies at which processors 12, 22, 32, 42 are operating change over time, fan manager 52 can adjust the control signals to the fans to account for the new operating parameters. The invention can thus allow independent fan control based on the configuration of the component it is cooling, resulting in optimized use of power and thermal resources in the system.

Figure 2:
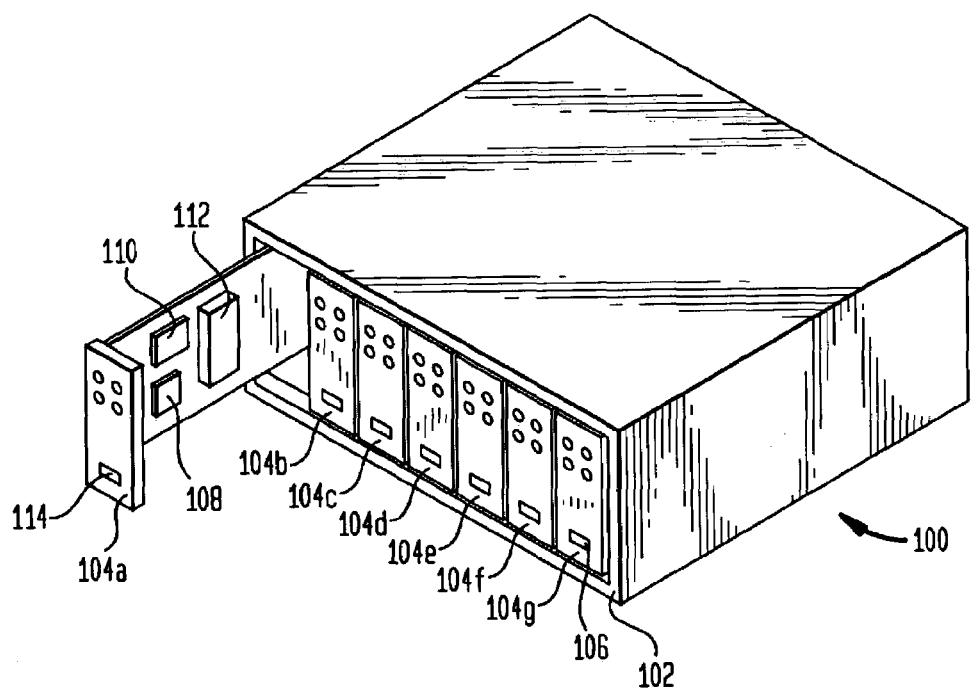
FIG. 2 is a perspective view of an exemplary blade system, in which aspects of the present invention can be implemented.

FIG. 2 is a diagram illustrating an exemplary electronic system, here blade system 100, suitable for implementing aspects of the present invention. Blade system 100 can, for example, house a combination of server blades, firewalls, routers and switches. A chassis 102 houses other components of blade system 100. Blades 104a-f slide into chassis 102 and plug into a backplane (not visible, but shown in FIG. 3 as backplane 202). Preferably, a blade manager 106 also slides into chassis 102 and plugs into the backplane, although blade manager 106 need not be removable, and for purposes of the present invention, need not be located in chassis 102. In addition, blade manager 106 can be connected to, and can control blades in, other chassis over a suitable network link. As one example of the monitoring and control that can be exercised by blade manager 106, reference is made to U.S. patent application Ser. No. 10/216,285; entitled "System and Method for Managing the Operating Frequency of Processors or Blades" and filed in August of 2002, which application is hereby incorporated by reference for its teaching of operating frequency monitoring and control in a bladed architecture (at both the blade and processor level), as well as the further U.S. patent applications listed as related and incorporated by reference into that application relating to further monitoring and control in a bladed architecture. Blade manager 106 can thus receive a variety of operational parameters relating to the activity of electronic modules such as blades 104 and components mounted on them, including, but not limited to, the number of blades connected, the number of blades that are operating, the operational frequency of any blades or of the components on any blades, the voltage at which any blades or components on any blades are operating, and the power consumed by any blades or components on any blades, the temperature and the rate of temperature change over time of any blades or components on any blades, and combinations of these operating parameters. These parameters can be received dynamically or periodically.

Each blade 104a-f contains appropriate components 108, 110 and 112, such as processors, memory, network interfaces, disk drives, etc., depending on the blade's intended function. Optionally, each blade 104a-f can include a connector 114, by which a keyboard, video monitor and mouse (collectively, "KVM") can be connected to the blade to provide a user interface therewith. Similarly, blade manager 106 can include an optional KVM connector 116 to provide a user interface with the blade manager. The invention, as described above with respect to FIG. 1, can be applied to blade system 100 by independently controlling cooling fans operatively connected to a plurality of components that can be located on a single blade, or across multiple blades.

Figure 3:
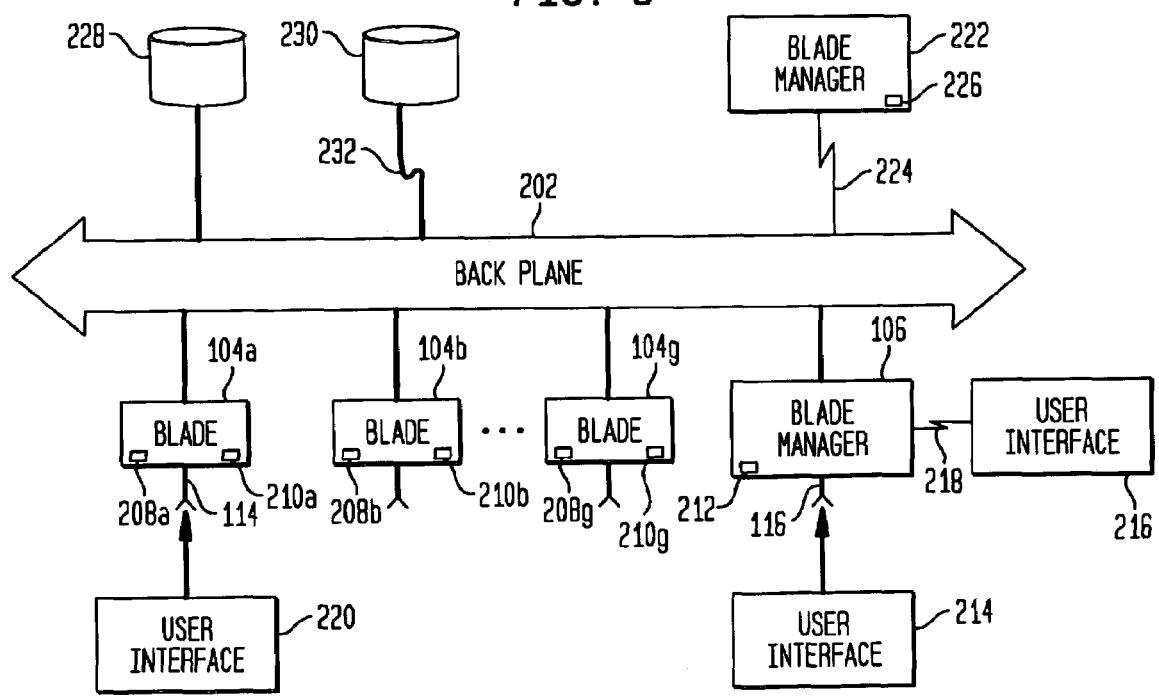
FIG. 3 is a schematic block diagram of the blade system of FIG. 2 illustrating components of the blade system, in accordance with one embodiment of the present invention.

FIG. 3 is an architectural block diagram of blade system 100. A backplane 202 interconnects components of blade system 100. Blades 104a-f and (optionally) blade manager 106 plug into backplane 202. Blade manager 106 communicates over backplane 202 with blade control circuits 208a-f on each of the blades 104a-f, respectively. This communication is preferably carried over a dedicated set of signal lines in backplane 202. Alternatively, this communication can be over shared data lines in backplane 202 or over a signal path separate from the backplane. For example, a separate wire or wireless Ethernet connection can be used. Blade control circuits 208a-208f control availability of power, operation state of processor(s), and other aspects of the blades 104a-f, as is well known in the art.

Each blade 104a-f can include an EE-PROM 210a-f, respectively, or other type of persistent memory to store configuration information for the blade. Any type of persistent memory that retains its contents without the availability of power can be used. The configuration information can include, for example, a serial number and license information, as described in detail below. The following discussion is presented in the context of blade 104a. Unless otherwise noted, the following description applies to any blade 104a-f.

Blade manager 106 can also include an EE-PROM 212 or other type of persistent memory. The blade manager's persistent memory need not be co-located with blade manager 106, as long as the persistent memory is accessible to blade manager. For example, the persistent memory can be a disk drive and/or it can be located elsewhere in chassis 102. Alternatively, the blade manager's persistent memory can be made up of several parts, each in a different location. Alternatively, blade managers 222 of several blade systems 100 can share a common persistent memory that is suitably connected to the blade managers. In the following discussion, persistent memory 212 will be referred to herein as EE-PROM 212 for simplicity, but the discussion applies to any form of persistent memory.

As discussed in relation to FIG. 2, a user interface 214 can be connected to blade manager 106 via the connector 116. Alternatively, a remote user interface 216 can be connected to blade manager 106 via a network link or other suitable connection 218. In the following discussion, reference to user interface 214 also applies to user interface 216. Optionally, a user interface 220 can connect to blade 104a via connector 114. Alternatively, user interface 214 or 216 can communicate with blade 104a. In this case, blade manager 106 relays commands and responses to and from blade 104a over backplane 202.

As discussed above, blade manager 106 need not be located within blade system 100. For example, remote blade manager 222 can communicate with blade system 100 over a communication link 224. Such a communication link 224 can be provided by, for example, a wire or wireless local area network (LAN). As with blade manager 106, remote blade manager 222 includes an EE-PROM or other suitable persistent memory 226 and can have a directly-connected or remote user interface (not shown), similar to the user interfaces 214 and 216. As discussed above, blade manager 106 can communicate with and control blades in another chassis via a communication link 224. The following discussion refers to blade manager 106. However, unless otherwise noted, the following discussion also applies to remote blade manager 222.

Disk drives, such as local disk drive 228 or remote disk drive 230, can be connected to backplane 202. Remote disk drive 230 can be connected to backplane 202 via a suitable network connection 232, as is well know in the art.

Fan manager 52 (FIG. 1) functionality can be provided in various places in blade system 100. For example, where the processors having fans to be independently controlled reside on a single blade 104, fan manager functionality can be provided completely within blade control circuit 208 as that circuit can, through communication elements provided within the blade, communicate with each processor to determine an operational parameter of each processor, calculate a desired fan speed, and communicate a control signal to individual fans operatively connected to each processor in order to independently control the cooling of each processor. Alternatively, fan manager functionality can be provided in blade manager 106, which can receive operational parameter information and distribute fan control signals through blade control circuit 208 for individual processors and fans throughout blade system 100 as part of its blade management function, including, for example, storing to and receiving from persistent memory 226 the required operating parameters. Still further, and as explained above, fan manager 52 functionality can also be distributed to the heat dissipating component level. Fan manager functionality can thus be provided at the component level, at the card or blade level, at the system/blade manager level or at a combination of any two levels or even at all three levels so that system level monitoring and control, card level monitoring and control, and local operating parameters can all be considered in independently controlling the speed of a single fan.

The invention may also be embodied in a method of cooling heat dissipating components for an electronic system having a plurality of heat dissipating components, a cooling fan operatively connected to each heat dissipating component, and a fan manager. In this method, the fan manager determines an operating parameter for each heat dissipating component and generates control signals to independently control each cooling fan based on the operating parameter of the heat dissipating component that is operatively connected to that fan. In this embodiment, each of the other features of the invention described above may be employed.

Embodiments have been described in which the present invention is employed in a blade system to automatically or dynamically control cooling fans that are operatively connected to heat dissipating components. However, one of ordinary skill in the art can apply the teachings herein to systems having other types of electronic modules in addition to blades. For example, rack mounted servers or other rack mounted electronic components can have multiple heat dissipating components including multiple processors on a single server. Such rack mounted components often include control circuitry on each module that monitors and controls local operating conditions, typically in communication with a dedicated controller or workstation running monitoring and control software such as that available from Hewlett-Packard Co. under the name OpenView. Such a system could readily be adapted to utilize the present invention.

The terms and expressions employed herein are used as terms of description, not of limitation. There is no intention, in using these terms and expressions, to exclude any equivalents of the features shown or described or portions thereof. Practitioners in the art will recognize that other modifications are possible within the scope of the invention claimed.

What is claimed is:

1. An electronic system comprising:
   a plurality of heat dissipating components, each component having an independently controllable cooling fan operatively connected thereto; and
   a fan manager communicating with each component to determine an operating parameter of each component and generating control signals to independently control each cooling fan based on the determined operating parameter for each component,
   wherein one or more of the heat dissipating components comprise processors, and wherein the determined operating parameter of the one or more processors includes at least one selected from a group consisting of an identification of an operating instruction to be processed in the future by the processor and an identification of whether an instruction to be processed by the processor is a high power consuming instruction.

2. The system of claim 1, wherein at least one cooling fan is controlled to have a different speed than at least one other cooling fan.

3. The system of claim 1, wherein the fan manager includes a plurality of distributed fan manager elements local to each heat dissipating component and configured to determine an operating parameter that is specific to the respective component.

4. The system of claim 1, wherein determining the operating parameter includes at least one selected from the group consisting of monitoring a system bus to determine instructions to be processed and communicating with a branch prediction unit of a processor.

5. The system of claim 3, wherein the fan manager further includes a centralized fan management element in communication with the distributed fan manager elements.

6. The system of claim 1, wherein the heat dissipating components are provided on one or more cards within the electronic system and the fan manager is divided among at least two of (a) heat dissipating component level fan managers, (b) a card level fan manager, and (c) a system level fan manager.

7. The system of claim 1, wherein the electronic system includes a plurality of electronic modules and at least one module controller.

8. The system of claim 7, wherein the electronic modules each include module control circuits that communicate with the module controller and the fan manager is implemented in at least one of the module control circuits and the module controller.

9. The system of claim 8, wherein the electronic system is a blade system, the electronic modules are blades, the module control circuits are blade control circuits, and the module controller is a blade controller.

10. The system of claim 9, wherein a plurality of the heat dissipating components are located on one blade.

11. The system of claim 8, wherein at least one electronic module is a rack mounted server and a plurality of the heat dissipating components are processors located on the rack mounted server.

12. The system of claim 1, wherein one or more of the operating parameters determined by the fan manager include the operational frequency of a heat dissipating component.

13. The system of claim 1, wherein one or more of the operating parameters determined by the fan manager include the operating voltage of a heat dissipating component.

14. The system of claim 1, wherein one or more of the operating parameters determined by the fan manager include the power consumed by a heat dissipating component.

15. A method of cooling heat dissipating components in an electronic system having a plurality of heat dissipating components, a cooling fan operatively connected to each heat dissipating component, and a fan manager, comprising:
   determining by the fan manager an operating parameter of each heat dissipating component; and
   generating by the fan manager of control signals to independently control each cooling fan based on the operating parameter of the heat dissipating component that is operatively connected to that fan,
   wherein one or more of the heat dissipating components comprise processors, and wherein the determined operating parameter of the one or more processors includes at least one selected from a group consisting of an identification of an operating instruction to be processed in the future by the processor and an identification of whether an instruction to be processed by the processor is a high power consuming instruction.

16. The method of claim 15, wherein at least one cooling fan is controlled to have a different speed than at least one other cooling fan.

17. The method of claim 15, wherein the fan manager includes a plurality of distributed fan manager elements local to each heat dissipating component and configured to determine an operating parameter that is specific to the respective component.

18. The method of claim 15, wherein determining the operating parameter includes at least one selected from the group consisting of monitoring a system bus to determine instructions to be processed and communicating with a branch prediction unit of a processor.

19. The method of claim 17, wherein the fan manager further includes a centralized fan management element in communication with the distributed fan manager elements.

20. The method of claim 15, wherein the heat dissipating components are provided on one or more cards within the electronic system and the fan manager is divided among at least two of (a) heat dissipating component level fan managers, (b) a card level fan manager, and (c) a system level fan manager.

21. The method of claim 15, wherein the electronic system includes a plurality of electronic modules and at least one module controller.

22. The method of claim 21, wherein the electronic modules each include module control circuits that communicate with the module controller and the fan manager is implemented in at least one of the module control circuits and the module controller.

23. The method of claim 22, wherein the electronic system is a blade system, the electronic modules are blades, the module control circuits are blade control circuits, and the module controller is a blade controller.

24. The method of claim 23, wherein a plurality of the heat dissipating components are located on one blade.

25. The method of claim 21, wherein at least one electronic module is a rack mounted server and a plurality of the heat dissipating components are processors located on the rack mounted server.

26. The method of claim 15, wherein one or more of the operating parameters determined by the fan manager include the operational frequency of a heat dissipating component.

27. The method of claim 15, wherein one or more of the operating parameters determined by the fan manager include the operating voltage of a heat dissipating component.

28. The method of claim 15, wherein one or more of the operating parameters determined by the fan manager include the power consumed by a heat dissipating component.

29. A fan manager for cooling heat dissipating components in an electronic system having a plurality of heat dissipating components and a cooling fan operatively connected to each heat dissipating component, comprising:
   a determinator communicating with each heat dissipating component to determine an operating parameter of each heat dissipating component;
   a controller generating control signals to independently control each cooling fan based on the determined operating parameter of the component operatively connected to that fan,
   wherein one or more of the heat dissipating components comprise processors, and wherein the determined operating parameter of the one or more processors includes at least one selected from a group consisting of an identification of an operating instruction to be processed in the future by the processor and an identification of whether an instruction to be processed by the processor is a high power consuming instruction.

30. A fan system for cooling a heat dissipating component within an electronic system, comprising:
   a fan controllable to a desired operating speed and operatively connected to the heat dissipating component; and
   a fan manager determining an operating parameter indicative of the heat dissipated by the heat dissipating component, calculating a control signal indicative of the desired speed of the fan based upon the value of the operating parameter, and communicating the control signal to the fan to control its speed,
   wherein one or more of the heat dissipating components comprise processors, and wherein the determined operating parameter of the one or more processors includes at least one selected from a group consisting of an identification of an operating instruction to be processed in the future by the processor and an identification of whether an instruction to be processed by the processor is a high power consuming instruction.

31. The system of claim 30, wherein the fan manager includes a distributed fan manager element local to the heat dissipating component and configured to determine an operating parameter that is specific to the respective component.

32. The system of claim 30, wherein determining the operating parameter includes at least one selected from the group consisting of monitoring a system bus to determine instructions to be processed and communicating with a branch prediction unit of a processor.

33. The system of claim 32, wherein the fan manager further includes a centralized fan management element in communication with the distributed fan manager element.

34. The system of claim 30, wherein the heat dissipating component is provided on one or more cards within the electronic system and the fan manager is divided among at least two of (a) heat dissipating component level fan managers, (b) a card level fan manager, and (c) a system level fan manager.

* * * * *